(12) United States Patent
Taneja et al.

(10) Patent No.: US 12,512,409 B2
(45) Date of Patent: Dec. 30, 2025

(54) HYBRID ETCH STOP LAYERS

(71) Applicant: Intel Corporation, Santa Clara, CA (US)

(72) Inventors: Deepyanti Taneja, Happy Valley, OR (US); Travis W. Lajoie, Forest Grove, OR (US); Abhishek Anil Sharma, Portland, OR (US); Gregory J. George, Beaverton, OR (US); Tarannum Tiasha, Beaverton, OR (US); Huiying Liu, Portland, OR (US); Yue Liu, Portland, OR (US); Moshe Dolejsi, Portland, OR (US); Vinaykumar V. Hadagali, Portland, OR (US); Shardul Wadekar, Hillsboro, OR (US); Vladimir Nikitin, Portland, OR (US); Albert B. Chen, Portland, OR (US); Daniel J. Schinke, Portland, OR (US); James O'Donnell, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 764 days.

(21) Appl. No.: 17/708,051

(22) Filed: Mar. 30, 2022

(65) Prior Publication Data
US 2023/0317615 A1    Oct. 5, 2023

(51) Int. Cl.
*H01L 23/532* (2006.01)
*H01L 23/528* (2006.01)
*H01L 23/522* (2006.01)

(52) U.S. Cl.
CPC ...... *H01L 23/5329* (2013.01); *H01L 23/5283* (2013.01); *H01L 23/53295* (2013.01); *H01L 23/5226* (2013.01)

(58) Field of Classification Search
CPC .......... H01L 23/5329; H01L 23/53295; H01L 23/5283
See application file for complete search history.

(56) References Cited

U.S. PATENT DOCUMENTS

| 2010/0025853 A1* | 2/2010 | Lindgren | H01L 23/5228 257/763 |
| 2016/0172239 A1* | 6/2016 | Padhi | H01L 23/5329 257/639 |

(Continued)

OTHER PUBLICATIONS

"Aluminium Nitride Structure." UniPreTec Technical Info. Accessed online May 15, 2025. (Year: 2025).*

(Continued)

*Primary Examiner* — Peter M Albrecht
(74) *Attorney, Agent, or Firm* — Finch & Maloney PLLC

(57) ABSTRACT

An integrated circuit includes a first layer, and a second layer above the first layer. A third layer is between a first section of the first layer and a first section of the second layer. A fourth layer is laterally adjacent to the third layer, the fourth layer between a second section of the first layer and a second section of the second layer. In an example, a first dielectric material of the third layer is different (e.g., one or both of compositionally different and structurally different) from a second dielectric material of the fourth layer. In an example, the third and fourth layers are etch stop layers. In some cases, the third and fourth layers are coplanar with each other with respect to their top surfaces, or their bottom surfaces, or both their top and bottom surfaces.

22 Claims, 9 Drawing Sheets

(56) References Cited

U.S. PATENT DOCUMENTS

2018/0254290 A1\* 9/2018 Schuette ............... H01L 23/528
2022/0392802 A1\* 12/2022 Tien .................. H01L 23/53295
2023/0039823 A1\* 2/2023 Jeong ................... H10B 12/315

OTHER PUBLICATIONS

"Hermeticity." Collins English Dictionary—Complete and Unabridged, 12th Edition 2014. (Year: 2014).\*
"2.1 Silicon Dioxide Properties." L. Filipovic: Topography Simulation of Novel Processing Techniques. Accessed online May 14, 2025. (Year: 2025).\*
N. J. Ianno and T. J. Makovicka, "Measurement of the permeability of thin films." Review of Scientific Instruments, vol. 70, No. 4, Apr. 1999. (Year: 1999).\*

\* cited by examiner

HYBRID ETCH STOP LAYERS

FIELD OF THE DISCLOSURE

The present disclosure relates to integrated circuits, and more particularly, to etch stop layers in integrated circuits.

BACKGROUND

In modern integrated circuits, an etch stop layer is usually composed of a dielectric material and can be used between different layers of a given die. An etch stop acts to stop an etch process at the bottom of, and/or within as the case may be, a layer that is above the etch stop layer. For example, an interconnect structure usually includes multiple interconnect layers arranged in a stack above or below a device layer of a die. Each of the interconnect layers may include, for instance, dielectric material and one or more conductive interconnect features (e.g., vias and/or lines) and/or devices (e.g., transistor and capacitor of memory cell). The interconnect layers of the stack are usually separated from one another by an etch stop layer. An example etch stop layer is a relatively thin (e.g., 2 to 500 nanometers) layer of an appropriate dielectric material. There remain nontrivial issues associated with etch stop layers.

Figure 1A:
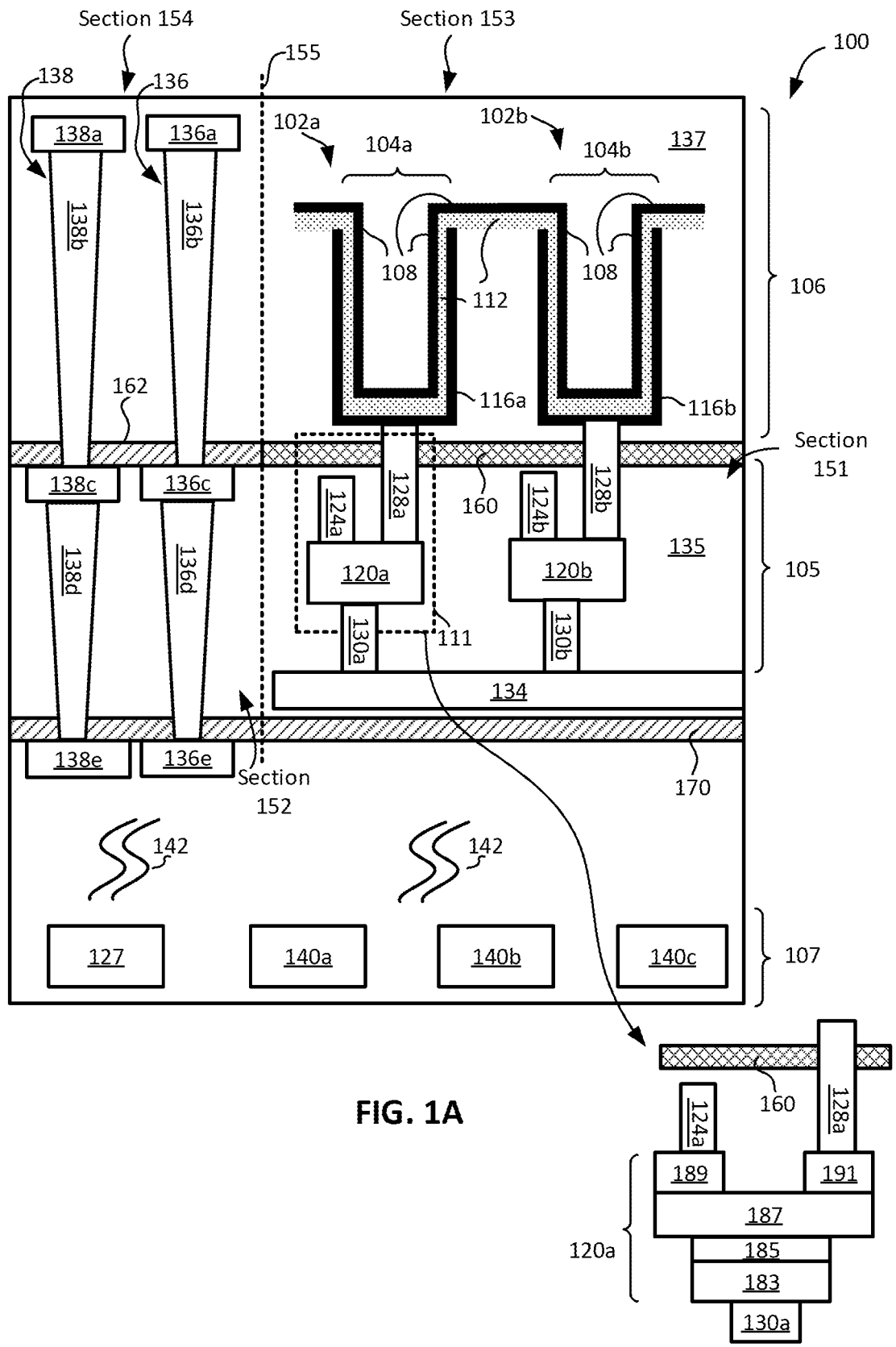
FIG. 1A illustrates a cross-sectional view of a section of an integrated circuit (IC) comprising (i) a first layer including a first section and a second section, (ii) a second layer above the first layer, (iii) a first etch stop layer between the first section of the first layer and the second layer, the first etch stop layer comprising a first dielectric material, and (iv) a second etch stop layer between the second section of the first layer and the second layer, the second etch stop layer comprising a second dielectric material, wherein the first dielectric material is compositionally and/or structurally different from the second dielectric material, resulting in the first dielectric material and the second dielectric material having different values of at least one physical property, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Provided herein are integrated circuit structures comprising a hybrid etch stop layer above an underlayer. The etch stop layer is said to be a hybrid etch stop layer because it includes first and second portions that are compositionally and/or structurally different from one another, and in this manner, resulting in the first and second portions having different values of at least one physical property, in accordance with an embodiment of the present disclosure. The at least one physical property may be, for example, with respect to permeability, hermeticity, porosity, density, dielectric constant, or another appropriate physical property. The underlayer may be, for instance, a device layer or an interconnect layer. In one example embodiment, a first section of the underlayer, which is below the first portion of the hybrid etch stop layer, comprises transistors, such as thin film transistors (TFTs) of one or more memory cells, such as Dynamic Random-Access Memory (DRAM) cells. In an example, a second section of the underlayer, which is below the second portion of the hybrid etch stop layer, lacks any transistors of a memory cell, and contains interconnect features and dielectric material. In one embodiment, an integrated circuit includes a first layer, and a second layer above the first layer. A third layer is between a first section of the first layer and a first section of the second layer, and has a thickness between the first and second layers in the range of 0.5 to 20 nanometers. A fourth layer is laterally adjacent to the third layer, the fourth layer between a second section of the first layer and a second section of the second layer. The fourth layer has a thickness between the first and second layers in the range of 0.5 to 20 nanometers. In an example, a first dielectric material of the third layer is different (e.g., one or both of compositionally different and structurally different) from a second dielectric material of the fourth layer. In an example, the third and fourth layers are etch stop layers. In some such cases, the etch stop layers are coplanar with each other with respect to their top surfaces, or their bottom surfaces, or both their top and bottom surfaces.

In another embodiment, an integrated circuit includes a first layer comprising (i) a first section including one or more TFTs, and (ii) a second section laterally adjacent to the first section. In an example, the second section of the first layer lacks a TFT, such as the case where the second section only includes one or more interconnect features and/or dielectric material. A second layer is above the first layer, the second layer comprising (i) a third section that is above the first section of the first layer and that includes one or more capacitors, and (ii) a fourth section. In an example, the fourth section of the second layer lacks a capacitor, such as the case where the fourth section only includes one or more interconnect features and/or dielectric material. A first etch stop layer is between the first section of the first layer and the third section of the second layer. A second etch stop layer between the second section of the first layer and the fourth section of the second layer. In an example, a first dielectric material of the first etch stop layer and a second dielectric material of the second etch stop layer have different values of a physical property (e.g., hermeticity and/or density).

In yet another embodiment, an integrated circuit device includes a first section comprising a plurality of memory cells of a memory array, and a second section that is laterally adjacent to the first section and that lacks any memory cell of the memory array. In an example, the second section includes one or more interconnect features. In an example, a first etch stop layer is within the first section. In an example, a second etch stop layer is laterally adjacent to the first etch stop layer and is within the second section. In some such cases, the etch stop layers are coplanar with each other with respect to their top surfaces, or their bottom surfaces, or both their top and bottom surfaces. In an example, the second etch stop layer is different (e.g., one or both of compositionally different and structurally different) from the first etch stop layer. In an example, the plurality of memory cells comprises at least one memory cell including (i) a transistor within the first section and below the first etch stop layer, and (ii) a capacitor within the first section and above the first etch stop layer. In an example, the memory cell is a Dynamic Random-Access Memory (eDRAM) cell.

Numerous variations, embodiments, and applications will be apparent in light of the present disclosure.

General Overview

As previously noted, there are nontrivial issues associated with etch stop layers. For instance, after an etch stop layer is formed above an underlayer, it may be desirable to process, through the etch stop layer, a first section of the underlayer differently from a second section of the underlayer. However, an etch stop layer having substantially homogenous dielectric material above both the first and second sections of the underlayer does not allow such spatially selective processing.

Accordingly, techniques are provided herein to form a hybrid etch stop layer above an underlayer, where the hybrid etch stop layer is a combination of laterally adjacent first and second etch stop layers, and wherein the hybrid etch stop layer allows for spatially selective processing of sections of the underlayer. The underlayer can be, for example, an interconnect layer composed of dielectric material and one or more interconnect features and/or devices (e.g., capacitor and transistor of memory cell), or a device layer having a plurality of transistors (e.g., metal oxide semiconductor field effect transistors, or MOSFETs) within dielectric material. In a more general sense, the underlayer can be any layer or layers under the hybrid etch stop layer.

In an example, a first dielectric material of the first etch stop layer is different from a second dielectric material of the second etch stop layer. In one such example, the first dielectric material of the first etch stop layer is compositionally different from the second dielectric material of the second etch stop layer. Alternatively, or additionally, the first dielectric material is deposited using a first type of deposition process and the second dielectric material is deposited using a second type of deposition process, resulting in a structural quality (e.g., crystalline structure, crystalline orientation, amorphous versus crystalline) of the first dielectric material being different from that of the second dielectric material. In an example, due to the compositional and/or structural difference between the dielectric materials of the laterally adjacent first and second etch stop layers, one or more physical properties of the first and second etch stop layers are different.

For example, the above discussed first dielectric material of the first etch stop layer is more permeable and/or more porous than the second dielectric material of the second etch stop layer. In another example, a dielectric constant of the first dielectric material is less than that of the second dielectric material. Still other example physical properties of the first and second etch stop layers may be different, such as density, hermeticity, and/or adhesiveness to metal, as will be discussed herein in further detail in turn. In an example, as the first dielectric material of the first etch stop layer is compositionally and/or structurally different from the second dielectric material of the second etch stop layer, spatially selective processing of sections of the underlayer is possible.

In an example, an upper layer is above the underlayer and the first and second etch stop layers. For example, assume that a first section of the upper layer is above the first etch stop layer, which is above the first section of the underlayer. Similarly, assume that a second section of the upper layer is above the second etch stop layer, which is above the second section of the underlayer. In one such example, the first section of the underlayer comprises one or more transistors, such as one or more TFTs; and the first section of the upper layer comprises one or more capacitors. In an example, a TFT of the first section of the underlayer and a corresponding capacitor of the first section of the upper layer form, or are part of, a memory cell, such as a DRAM cell (e.g., an eDRAM cell). In an example, TFTs of memory cells are absent in the second section of the underlayer, and capacitors of memory cells are absent in the second section of the upper layer. For example, the second section of the underlayer includes interconnect features and/or logic circuits for the memory cells. Similarly, the second section of the upper layer comprises interconnect features.

In an example, to form the hybrid etch stop layer, the underlayer (including one or more layers below the underlayer) is formed, and the second etch stop layer is formed above the underlayer. The second etch stop layer is patterned, to remove a portion of the second etch stop layer above the first section of the underlayer, while the second etch stop layer is not removed from above the second section of the underlayer. Subsequently, the first etch stop layer is deposited above the first section of the underlayer, as well as above the second etch stop layer. Subsequently, the first etch stop layer is polished and planarized, such that the first and second etch stop layers are laterally adjacent to each other, and such that top surfaces of the two etch stop layers are substantially coplanar (e.g., such as the case where the top surfaces are separated by a vertical distance of at most 5 angstroms, or at most 1 nanometer), thereby forming the hybrid etch stop layer above the underlayer. The first etch stop layer is now above the first section of the underlayer, and the second etch stop layer is now above the second section of the underlayer. In an example, the planarization process may be optionally skipped, e.g., such that the top surfaces of the two etch stop layers are not coplanar, e.g., as discussed with respect to FIG. 1C herein in turn.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a hybrid etch stop layer above a given underlayer, where the hybrid etch stop layer includes a first etch stop layer above a first section of the underlayer and a second etch stop layer above a second section of the underlayer, where the first and second etch stop layers are structurally and/or compositionally different, and has different values of one or more physical properties. In some such embodiments, such tools may also be used to detect, for example, one or more transistors, such as thin film transistors (TFTs) of one or more memory cells, within the first section of the underlayer, and corresponding one or more capacitors of the one or more memory cells within an upper layer above the first etch stop layer. Numerous configurations and variations will be apparent in light of this disclosure.

Architecture and Methodology

FIG. 1A illustrates a cross-sectional view of a section of an integrated circuit (IC) 100 comprising (i) a first layer 105 including a first section 151 and a second section 152, (ii) a second layer 106 above the first layer 105, (iii) a first etch stop layer 160 between the first section 151 of the first layer 105 and the second layer 106, the first etch stop layer 160 comprising a first dielectric material, and (iv) a second etch stop layer 162 between the second section 152 of the first layer 105 and the second layer 101*b*, the second etch stop layer 162 comprising a second dielectric material, wherein the first dielectric material is compositionally and/or structurally different from the second dielectric material, resulting in the first dielectric material and the second dielectric material having different values of at least one physical property, in accordance with an embodiment of the present disclosure.

The layer 105 is under the etch stop layers 160 and 162, and the layer 105 is also referred to herein as an underlayer 105. The layer 105 can be, for example, an interconnect layer composed of dielectric material 135 and one or more interconnect features and/or devices (e.g., capacitor and/or transistor of memory cell, logic circuits for a memory array), or a device layer having a plurality of transistors (e.g., metal oxide semiconductor field effect transistors, or MOSFETs) within dielectric material 135. In a more general sense, the underlayer 105 can be any layer or layers under the etch stop layers 160, 162. In an example, the layer 105 comprises a plurality of active and/or passive devices 120*a*, 120*b*, which may be transistors, resistors, capacitors, inductors, and/or any appropriate component(s) present in an IC. In an example, the devices 120*a*, 120*b* are within dielectric material 135 of the layer 105. Although merely two devices 120*a*, 120*b* are illustrated, in an example, many more such devices may be present within the layer 105. The devices are symbolically illustrated using rectangular boxes, although actual shape and/or location of the devices within the layer 105 may be different from those illustrated in FIG. 1A.

In an example, an imaginary dotted vertical line 155 (which may be a plane in the three-dimensional IC 100) divides the layer 105 into two corresponding sections: a section 151 that is on the right of the line 155, and a section 152 that is on the left of the line 155, for example. In an example, the imaginary line (or plane) 155 also passes through a boundary between the etch stop layers 160 and 162. Thus, the etch stop layer 160 is above the section 151 of the layer 105, and the etch stop layer 162 is above the section 152 of the layer 105, as illustrated in FIG. 1A. Thus, the etch stop layer 160 forms an upper boundary of the section 151 of the layer 105, and the etch stop layer 162 forms an upper boundary of the section 152 of the layer 105. An etch stop layer 170 forms lower boundaries of the sections 151 and 152.

In an example, the imaginary dotted vertical line (or plane) 155 also divides the layer 106 into two corresponding sections: a section 153 that is on the right of the line 155, and a section 154 that is on the left of the line 155, for example.

As illustrated, the section 153 of the layer 106 is above the etch stop layer 160, which is above the section 151 of the layer 105. Similarly, the section 154 of the layer 106 is above the etch stop layer 162, which is above the section 152 of the layer 105.

In an example, the section 151 of the layer 105 comprises devices 120a, 120b, which are, for example, transistors, such as thin film transistors (TFT). In an example, the section 153 of the layer 106 comprises capacitors 104a, 104b. In an example, each transistor 120 and a corresponding capacitor 104 form, or otherwise are a part of, a corresponding memory cell 102. For example, the transistor 120a and the capacitor 104a form, or otherwise are a part of, a memory cell 102a. Similarly, the transistor 120b and the capacitor 104b form, or otherwise are a part of, a memory cell 102b. In an example, individual memory cells 102a, 102b are DRAM cells, such as embedded DRAM (eDRAM) cells.

In a memory cell 102, such as the memory cell 102a for example, the capacitor 104a stores a bit of information and the transistor 120a allows for writing and reading that bit. For example, the capacitor 104a can either be charged or discharged and these two states are used to represent two possible bit values 0 or 1. As illustrated in Fig. A1, the capacitor 104a comprises an electrode 116a, and similarly, the capacitor 104b comprise an electrode 116b. As also illustrated in FIG. 1A, the capacitors 104a and 104b comprise a common electrode 108. For example, a first section of the electrode 108 is within the capacitor 104a, and a second section of the electrode 108 is within the capacitor 104b, and the first and second sections of the electrode 108 are conjoined or conductively coupled. In an example where there are more than two memory cells 102a, 102b within the sections 151, 153, the electrode 108 may be common to more than two memory cells. In one embodiment, the electrodes 116, 108 may include any suitable electrically conductive material, such as a metal or metal alloy material including, e.g., copper, silver, aluminum, tantalum (Ta), aluminum (Al), tungsten (W), nickel (Ni), platinum (Pt), molybdenum (Mo), manganese (Mn), or an alloy thereof, such as titanium nitride (TiN), tantalum nitride (TaN), titanium aluminum nitride (TiAlN), molybdenum oxide (MoO2), manganese oxide (MnO2), tungsten oxide (WO2), or another appropriate conductive material. In one embodiment, the capacitors 104a, 104b are within an Interlayer Dielectric (ILD) material 137 of the layer 106.

In one embodiment, one or more layers 112 of dielectric material are between the electrode 116a and the electrode 108, and also between the electrode 116b and the electrode 108. The layers 112 comprising dielectric material form the "I" part of MIM (metal-insulator-metal) capacitors 104a, 104b. Although not illustrated in FIG. 1A, the layers 112 may comprise one or more distinct and/or compositionally different layers of dielectric material. For example, the layers 112 comprise corresponding one or more thin films of one or more metal oxides, such as one or more oxides of hafnium (Hf), aluminum (Al), zirconium (Zr), titanium (Ti), tantalum (Ta), or another appropriate metal. Although FIG. 1A illustrates specific structures of the capacitors 104, e.g., in which the electrodes have an "U" shape, in other examples, the capacitors 104 can have another appropriate structure or shape. Merely as an example, double-walled type capacitors, or pillar type capacitors can be used, instead of (or in addition to) the "U" shaped capacitors illustrated in FIG. 1A. For instance, rather than being U-shaped, capacitor 104a may have a relatively flat configuration with upper and lower electrodes, or a pillar-shaped configuration with inner and outer electrodes. In other embodiments, capacitor 104a may have a different shape or configuration.

As discussed, each of the memory cells 102 comprise a corresponding capacitor 104 and a corresponding transistor 120. In FIG. 1A, individual transistors 120 are illustrated symbolically as a black box. A section 111 of the IC, which includes transistor 120a, is illustrated in further detail in FIG. 1A. As previously discussed herein, in an example, the device 120a is a transistor, such as a thin film transistor or TFT, used to form memory cells, such as DRAM cells, e.g., embedded DRAM (eDRAM) cells. For example, the transistor 120a is coupled to the corresponding capacitor 104a within the layer 106, and the transistor 120a and the capacitor 104a, in combination, form or are part of a DRAM (such as eDRAM) cell 102a. The transistor 120a within the layer 105 may have a number of configurations. In an example, the transistors 120 are TFTs, while in some other examples transistors 120 may be MOSFETs. In an example, the layer 105 including the transistors 120 are formed at BEOL (back end of line) process during formation of the IC, above or below a previously formed device layer 107 that includes, for example, logic transistors, input/output (I/O) transistors, and/or radio frequency transistors (RF).

In an example, transistor 120a has a bottom-gate TFT configuration, where the source and drain terminals are above the transistor 120a, and the gate terminal is below the transistor 120a. In an example, the transistor 120a includes a gate electrode 183, which in some examples is coupled, for instance, to a word line 134 of the memory cell 102a through a gate contact 130a. The word line 134 is common for the memory cells 102a, 102b.

In an example, the transistor 120a comprises a channel layer 187. The gate electrode 183 is below the channel layer 187 in the bottom-gate TFT configuration of FIG. 1A. A gate dielectric layer 185, e.g., a high-k layer, is located between the channel layer 187 and the gate electrode 183. A first source or drain region 189 and a second source or drain region 191 are above the channel layer 187 in the bottom-gate TFT configuration of FIG. 1A.

In an example, the channel layer 187 may include one or more of indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly-III-V like indium arsenide (InAs), indium gallium arsenide (InGaAs), indium phosphide (InP), amorphous indium gallium zinc oxide (InGaZnO, sometimes referred to as a-IGZO), crystal-like InGaZnO (c-IGZO), gallium zinc oxynitride (GaZnON), zinc oxynitride (ZnON), molybdenum and sulfur, a group-VI transition metal dichalcogenide, and a c-axis aligned crystal (CAAC) layer.

In an example, the first source or drain region 189 may be coupled to, for example, a bit line of the memory cell 120a, through a source or drain contact 124a. In the example shown, the second source or drain region 191 is coupled to the electrode 116a of the capacitor 104a of the memory cell 102a, e.g., through a source or drain contact 128a (or through a conductive structure that is above the source or drain contact 128a and that extends through the etch stop layer 160). The source or drain contacts and/or the conductive structure may include, for example, one or more of titanium (Ti), molybdenum (Mo), gold (Au), platinum (Pt), aluminum (Al), nickel (Ni), copper (Cu), chromium (Cr), hafnium (Hf), indium (In), ruthenium (Ru), and an alloy of Ti, Mo, Au, Pt, Al, Ni, Cu, Cr, Ru, TiAlN, HfAlN, InOx, HfOx, AlOx, or InAlO.

Thus, as discussed, section 151 of the layer 105 is below the etch stop layer 160, and section 153 of the layer 106 is above the etch stop layer 160, where the sections 151 and 153 respectively include transistors (such as TFTs) and capacitors of one or more memory cells. Note that in an example, the section 152 of the layer 105 does not include a transistor of a memory cell, and the section 154 of the layer 106 does not include a capacitor of a memory cell.

In an example, the section 152 of the layer 105 and the section 154 of the layer 106 comprises a plurality of interconnect features, such as interconnect features 136 and 138. For example, interconnect feature 138 comprises a conductive line 138e, a conductive via 138d above and in contact with the conductive line 138e, and a conductive line 138c above and in contact with the conductive via 138d, wherein the conductive via and lines 138c, 138d, 138e are within the section 152 of the layer 105. The interconnect feature 138 also comprises a conductive via 138b above and in contact with the conductive line 138c, and a conductive line 138a above and in contact with the conductive via 138b, wherein the conductive via and line 138b, 138a are within the section 154 of the layer 106. The interconnect feature 136 also has a similar structure.

Thus, in an example, TFTs of one or more DRAM (e.g., eDRAM) cells are within the section 151 and capacitors of the one or more DRAM cells are within the section 153. Accordingly, a combination of the sections 151 and 153 is also referred to herein as a memory section of a memory array, and the etch stop layer 160 is within the memory section. Similarly, a combination of the sections 154 and 152 is also referred to herein as an interconnect section, and the etch stop layer 162 is within the interconnect section.

In an example, there is an etch stop layer 170 below the sections 151 and/or 152 of the layer 105. For example, the etch stop layer 170 is below both the sections 151 and 152 of the layer 105, as illustrated in FIG. 1A. In an example, the etch stop layer 170 is compositionally and/or structurally at least in part similar to the etch stop layer 162. In an example, the etch stop layer 170 is compositionally and/or structurally different from the etch stop layer 160.

In an example, there are one or more additional etch stop layers, and one or more additional underlayers (e.g., interconnect layers) below the etch stop layer 170, where these layers are symbolically depicted with lines 142. As can be further seen, a device layer 107 is below etch stop layer 170, and includes one or more active and/or passive devices 127, 140a, 140b, 140c, such as one or more transistors 127 and 140.

In an example, one or more of the devices 127 include transistors that form logic circuits (e.g., sense amplifier, word line selector, bit line selector, or other appropriate logic circuits) for the DRAM cells 102. Although a single transistor 127 is illustrated, the layer 107 is likely to include several such transistors 127. The transistors 140 are any appropriate transistors that are specific to an application of the IC 100.

Referring now to the etch stop layers 160 and 162, in an example, the etch stop layers 160, 162 are laterally adjacent to, and in direct contact with each other. In an example, bottom surfaces of the etch stop layers 160, 162 are substantially coplanar. For example, a bottom surface of the etch stop layer 160 is at least in part within a first horizontal plane, a bottom surface of the etch stop layer 162 is at least in part within a second horizontal plane, and the bottom surfaces of the etch stop layers 160, 162 are substantially coplanar such that the first and second horizontal planes are separated by a vertical distance of at most 0.5 nanometers (nm), or at most 1 nm.

In an example, top surfaces of the etch stop layers 160, 162 are also at least in part substantially coplanar, e.g., separated by a vertical distance of at most 0.5 nm, or at most 1 nm. For example, at least a section of the top surface of the etch stop layer 160 is substantially coplanar with at least a section of the top surface of the etch stop layer 162. In an example, some section of the top surface of the etch stop layer 160 may not be substantially coplanar with some section of the top surface of the etch stop layer 162, e.g., due to standard variation in topology of various layers arising from unintended technical limitations in processes used to form the layers.

In an example, one or both the etch stop layers 160, 162 have a vertical height or thickness between the layers 105 and 106 in the range of 0.5 nm to 500 nm, or in an appropriate subrange therewithin, such as between 0.5 to 2 nm, 0.5 to 4 nm, 0.5 to 8 nm, 0.5 to 20 nm, 0.5 to 40 nm, 0.5 to 100 nm, 0.5 to 400 nm, 2 to 20 nm, 2 to 100 nm, 2 to 200 nm, or another appropriate subrange.

In an example, the etch stop layer 160 comprises a first dielectric material, and the etch stop layer 162 comprises a second dielectric material that is compositionally and/or structurally different from the first dielectric material of the etch stop layer 160.

For example, the dielectric material of the etch stop layer 162 comprises one or more of silicon nitride (SiN), silicon carbide (SiC), or another appropriate dielectric material. In an example, the dielectric material of the etch stop layer 160 comprises one or more of silicon oxide (SiOx), silicon oxynitride (SiON), aluminum oxide ($AlO_x$), silicon aluminum oxide ($SiAlO_x$), or another appropriate dielectric material that is different from the dielectric material of the etch stop layer 162. Thus, in this example, the dielectric material of the etch stop layer 160 is compositionally different from the dielectric material of the etch stop layer 162.

In an example, instead of, or in addition to, being compositionally different, the dielectric materials of the two etch stop layers 160, 162 may be structurally different. For example, first dielectric material of the etch stop layer 160 is deposited using a first type of deposition process, and second dielectric material of the etch stop layer 162 is deposited using a second type of deposition process, thereby resulting in the structural differences between the two dielectric materials. Merely as an example, one of the first and second dielectric material is formed using one of chemical vapor deposition (CVD), atomic layer deposition (ALD), physical vapor deposition (PVD), and the other of first and second dielectric materials are formed using another of CVD, ALD, PVD. Due to the different deposition process used, a structural quality (e.g., crystalline structure, crystalline orientation, amorphous versus crystalline) of the first dielectric material may be different from that of the second dielectric material.

In an example, due to the compositional and/or structural difference between the dielectric materials of the etch stop layers 160, 162, one or more physical properties of the etch stop layers 160 and 162 are different. Some example differences in physical properties of the two etch stop layers 160, 162 are discussed herein below.

For example, a permeability of the etch stop layer 160 may be different from a permeability of the etch stop layer 162. In an example, a permeability of the dielectric material of the etch stop layer 160 is more than a permeability of the dielectric material of the etch stop layer 162.

In another example, a porosity of the dielectric material of the etch stop layer 160 is different from (such as more than) a porosity of the dielectric material of the etch stop layer 162. For example, the etch stop layer 160 has relatively a greater number (or density) of pores and/or relatively larger pores therewithin, compared to the etch stop layer 162.

In yet another example, a dielectric constant of the dielectric material of the etch stop layer 160 is different from (e.g., less than) a dielectric constant of the dielectric material of the etch stop layer 162 (e.g., due to the etch stop layer 160 being more or less permeable and/or more or less porous than the etch stop layer 162). In an example, a density of the dielectric material of the etch stop layer 160 is different from (e.g., less than) a density of the dielectric material of the etch stop layer 162 (e.g., due to the etch stop layer 160 being more or less permeable and/or more porous or less than the etch stop layer 162).

In a further example, a hermeticity of the dielectric material of the etch stop layer 160 is different from (e.g., less than) a hermeticity of the dielectric material of the etch stop layer 162. In another example, an adhesiveness of the dielectric material of the etch stop layer 160 to metal (e.g., such as copper, of an interconnect feature) is different from (e.g., less than) an adhesiveness of the dielectric material of the etch stop layer 162 to metal (e.g., such as copper, of an interconnect feature). In yet another example, one or more other appropriate physical properties (such as breathability) of the etch stop layers 160 and 162 may also be different.

Thus, the etch stop layer 162 has one or more different physical properties relative to the etch stop layer 160. In an example, the hybrid nature of the etch stop layers 160 and 162 (i.e., two laterally abutting but structurally and/or compositionally different etch stop layers) allows the section 151 to be processed differently from the section 152 of the layer 105.

Figure 1B:
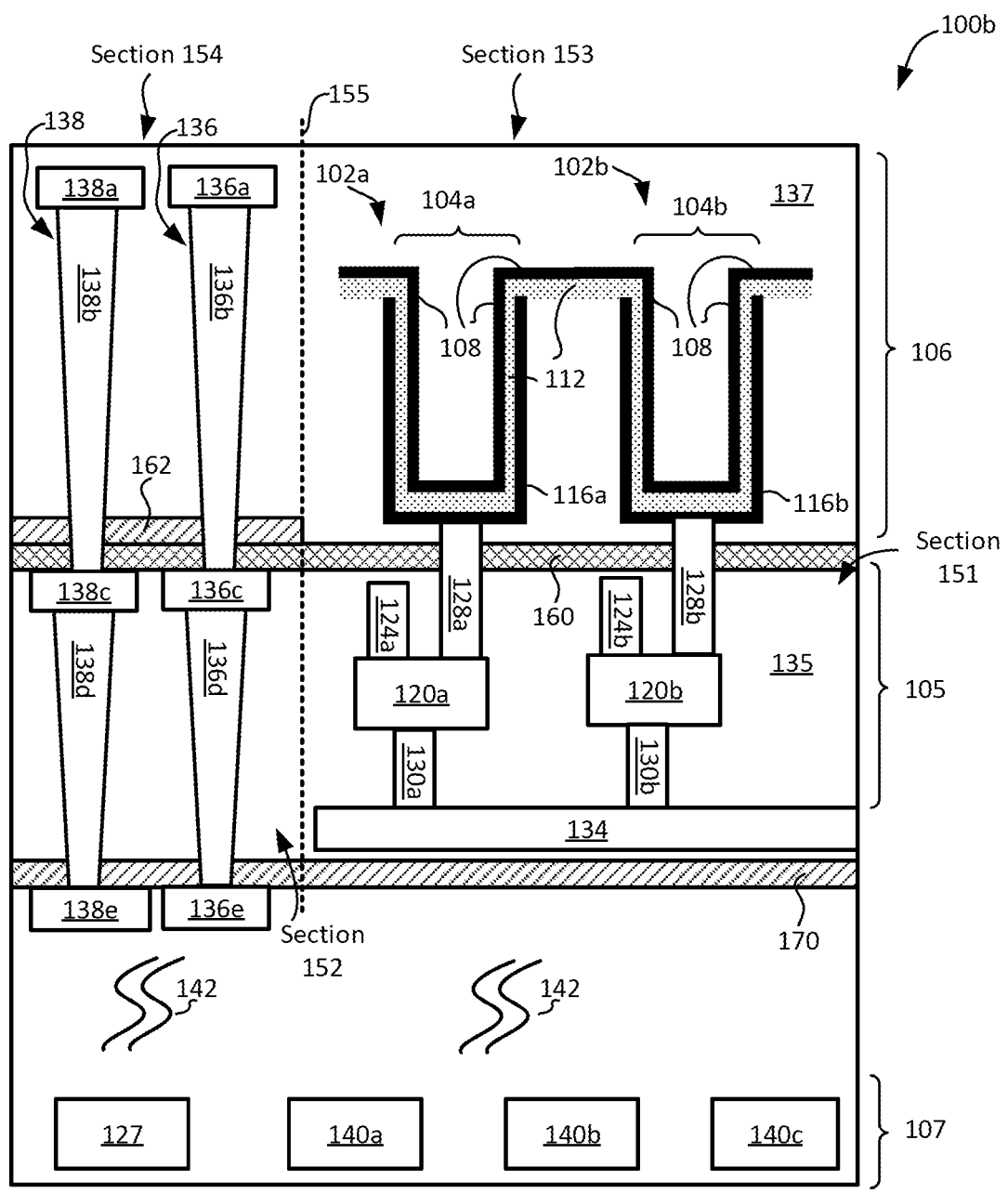
FIG. 1B illustrates a cross-sectional view of a section of an IC comprising (i) a first layer including a first section and a second section, (ii) a second layer above the first layer, (iii) a first etch stop layer between the first layer and the second layer, the first etch stop layer comprising a first dielectric material, and (iv) a second etch stop layer between the second section of the first layer and the second layer, the second etch stop layer comprising a second dielectric material, wherein the first dielectric material is compositionally and/or structurally different from the second dielectric material, resulting in the first dielectric material and the second dielectric material having different values of at least one physical property, in accordance with another embodiment of the present disclosure.

FIG. 1B illustrates a cross-sectional view of a section of an IC 100b comprising (i) a first layer 105 including a first section 151 and a second section 152, (ii) a second layer 106 above the first layer 105, (iii) a first etch stop layer 160 between the first layer 105 and the second layer 106, the first etch stop layer 160 comprising a first dielectric material, and (iv) a second etch stop layer 162 between the second section 152 of the first layer 105 and the second layer 101b, the second etch stop layer 162 comprising a second dielectric material, wherein the first dielectric material is compositionally and/or structurally different from the second dielectric material, resulting in the first dielectric material and the second dielectric material having different values of at least one physical property, in accordance with an embodiment of the present disclosure.

Figure 1C:
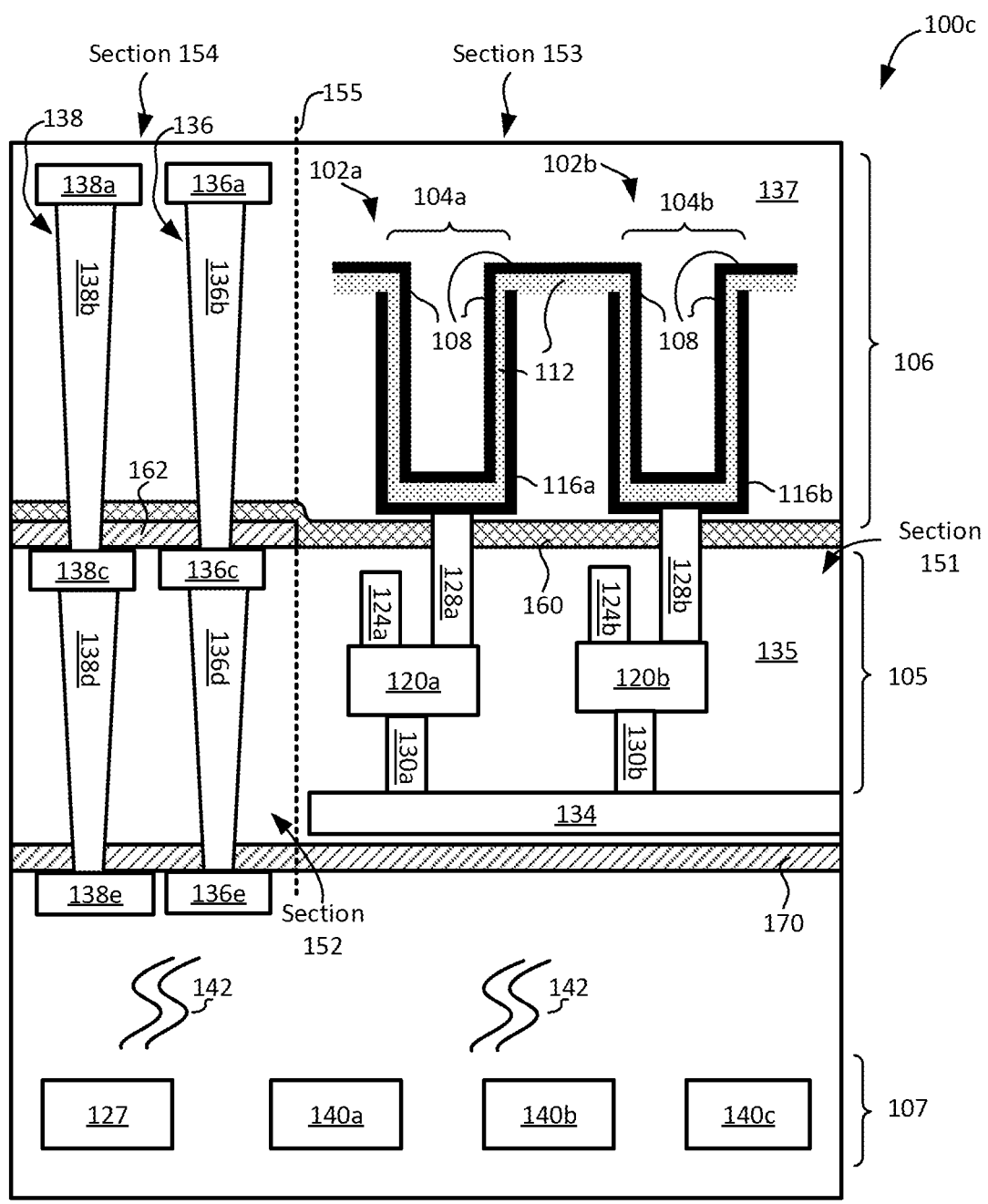
FIG. 1C illustrates a cross-sectional view of a section of an IC comprising (i) a first layer including a first section and a second section, (ii) a second layer above the first layer, (iii) a first etch stop layer between the first layer and the second layer, the first etch stop layer comprising a first dielectric material, and (iv) a second etch stop layer between the second section of the first layer and the first etch stop layer, the second etch stop layer comprising a second dielectric material, wherein the first dielectric material is compositionally and/or structurally different from the second dielectric material, resulting in the first dielectric material and the second dielectric material having different values of at least one physical property, in accordance with another embodiment of the present disclosure.

Similar components within the IC 100 of FIGS. 1A and 1C 100b of FIG. 1B are labelled using similar labels, and discussion of various components with respect to FIG. 1A, unless otherwise mentioned or contradictory in nature, are also applicable to FIG. 1B. The IC 100b of FIG. 1B is a least in part similar to the IC 100 of FIG. 1A. However, unlike FIG. 1A, in the IC 100b of FIG. 1B, the etch stop layer 160 is above both sections 151 and 152 of the layer 105. The etch stop layer 162 is above a section of the etch stop layer 160 that is above the section 152. Thus, the etch stop layer 160 is between the section 151 and the section 153. On the other hand, both the etch stop layers 160, 162 are between the section 152 and the section 154.

Thus, a portion of the single etch stop layer 160 is above the section 151. In contrast, a combination of the etch stop layer 162 and a portion of the etch stop layer 160 is above the section 152 of the layer 105. Thus, the hybrid nature of (i) the single etch stop layer 160 above the section 151 and (ii) the combined etch stop layers 160, 162 above the section 152 allows the section 151 to be processed differently from the section 152 of the layer 105.

FIG. 1C illustrates a cross-sectional view of a section of an IC 100b comprising (i) a first layer 105 including a first section 151 and a second section 152, (ii) a second layer 106 above the first layer 105, (iii) a first etch stop layer 160 between the first layer 105 and the second layer 106, the first etch stop layer 160 comprising a first dielectric material, and (iv) a second etch stop layer 162 between the second section 152 of the first layer 105 and the first etch stop layer 160, the second etch stop layer 162 comprising a second dielectric material, wherein the first dielectric material is compositionally and/or structurally different from the second dielectric material, resulting in the first dielectric material and the second dielectric material having different values of at least one physical property, in accordance with an embodiment of the present disclosure.

Similar components within the IC 100 of FIGS. 1A and 1C 100c of FIG. 1C are labelled using similar labels, and discussion of various components with respect to FIG. 1A, unless otherwise mentioned or contradictory in nature, are also applicable to FIG. 1C. The IC 100c of FIG. 1C is a least in part similar to the IC 100 of FIG. 1A. However, unlike FIG. 1A, in the IC 100c of FIG. 1C, the etch stop layer 160 is above both sections 151 and 152 of the layer 105. The etch stop layer 162 is above the section 152. For example, the etch stop layer 162 is between (i) the section 152 and (ii) a portion of the etch stop layer 160 that is below the section 154. Thus, the etch stop layer 160 is between the section 151 and the section 153. On the other hand, both the etch stop layers 160, 162 are between the section 152 and the section 154.

Figure 2:
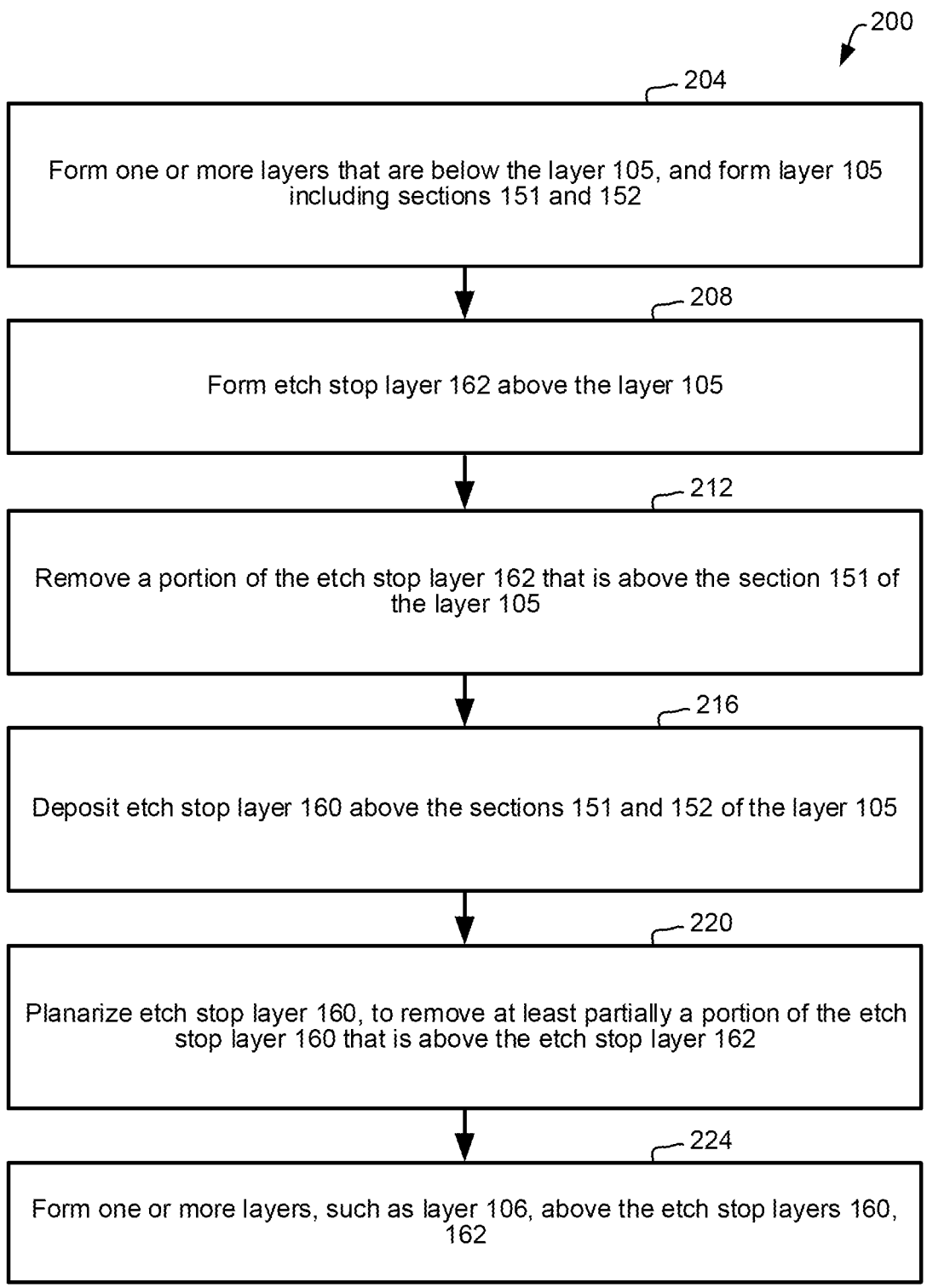
FIG. 2 illustrates a flowchart depicting a method of forming an IC (such as the IC of FIG. 1A) comprising (i) a first layer including a first section and a second section, (ii) a second layer above the first layer, (iii) a first etch stop layer between the first section of the first layer and the second layer, the first etch stop layer comprising a first dielectric material, and (iv) a second etch stop layer between the second section of the first layer and the second layer, the second etch stop layer comprising a second dielectric material, wherein the first dielectric material is compositionally and/or structurally different from the second dielectric material, resulting in the first dielectric material and the second dielectric material having different values of at least one physical property, in accordance with an embodiment of the present disclosure.

FIG. 2 illustrates a flowchart depicting a method 200 of forming an IC (such as the IC 100 of FIG. 1A) comprising (i) a first layer 105 including a first section 151 and a second section 152, (ii) a second layer 106 above the first layer 105, (iii) a first etch stop layer 160 between the first section 151 of the first layer 105 and the second layer 106, the first etch stop layer 160 comprising a first dielectric material, and (iv) a second etch stop layer 162 between the second section 152 of the first layer 105 and the second layer 106, the second etch stop layer 162 comprising a second dielectric material, wherein the first dielectric material is compositionally and/ or structurally different from the second dielectric material, resulting in the first dielectric material and the second dielectric material having different values of at least one physical property, in accordance with an embodiment of the present disclosure. FIGS. 3A, 3B, 3C, 3D, 3E, and 3F illustrate cross-sectional views of an IC (such as the IC 100 of FIG. 1A) in various stages of processing, in accordance with an embodiment of the present disclosure. FIGS. 2 and 3A-3F will be discussed in unison.

Figure 3A:
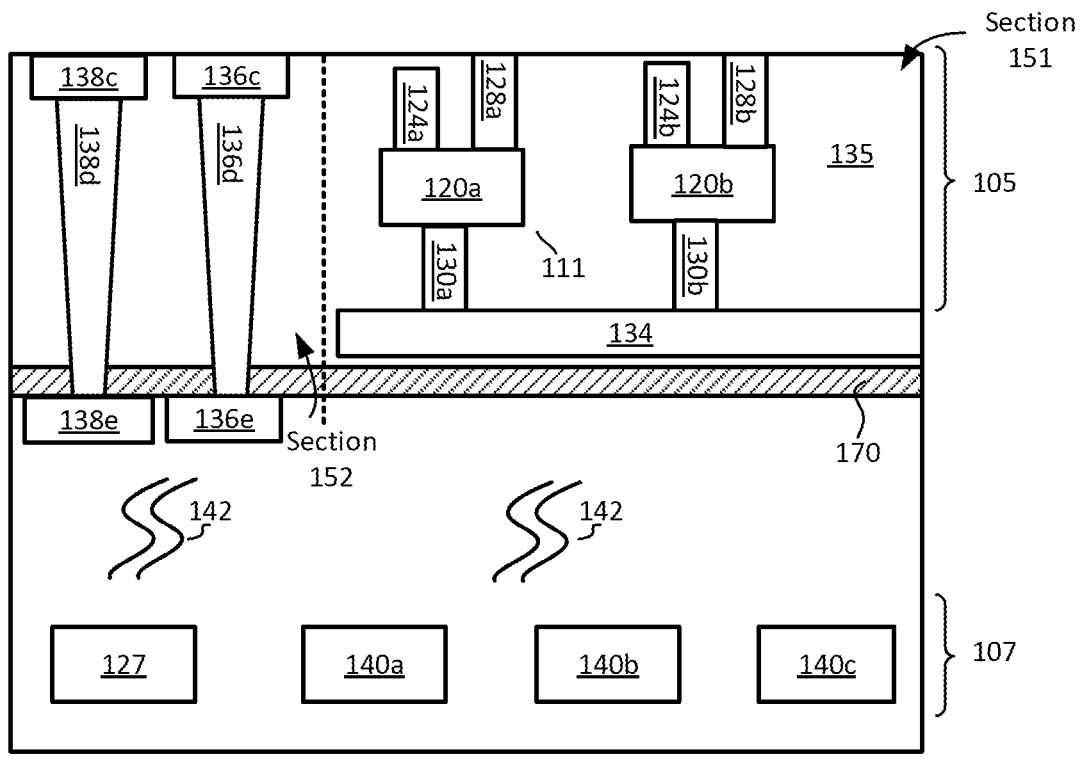
FIGS. 3A, 3B, 3C, 3D, 3E, and 3F illustrate cross-sectional views of an IC (such as the IC of FIG. 1A) in various stages of processing, in accordance with an embodiment of the present disclosure.

Referring to FIG. 2, the method 200 includes, at 204, forming one or layers that are below the layer 105 (such as layer 107, and one or more layers that are between the layers 107 and 105), and then forming layer 105 including sections 151 and 152, e.g., as illustrated in FIG. 3A. The various layers may be formed using appropriate techniques for forming device and/or interconnect layers within an IC.

Figure 3B:
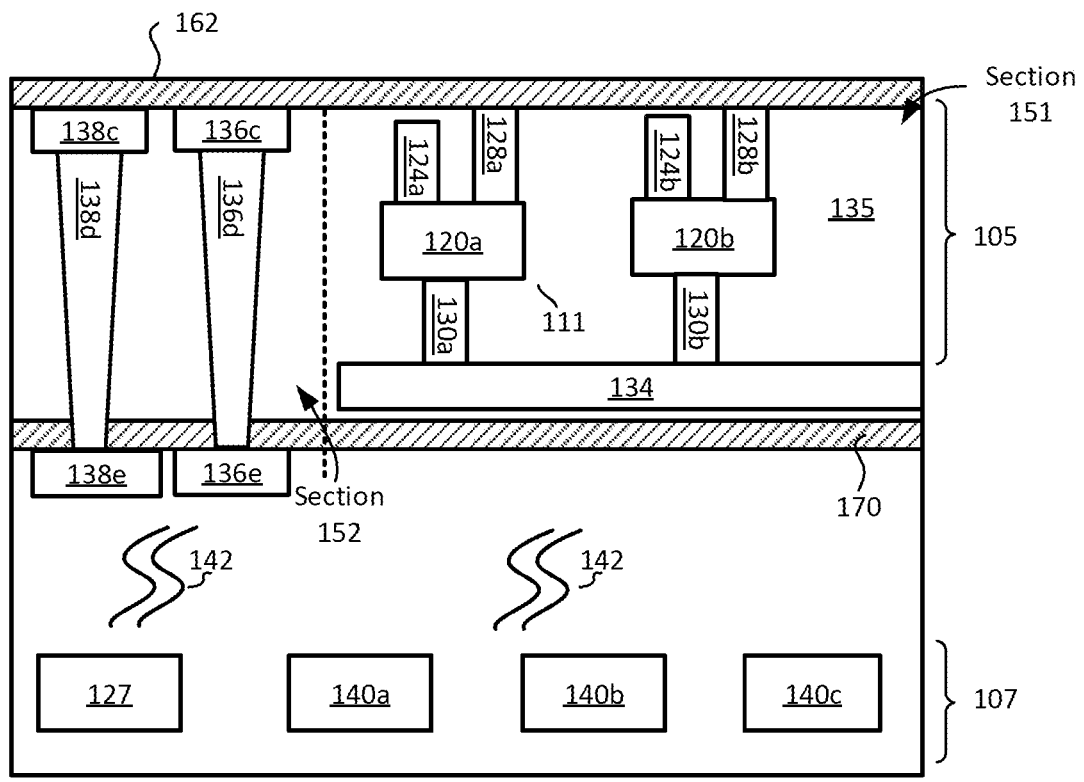

Referring again to FIG. 2, the method 200 then proceeds from 204 to 208, where the relatively less porous and/or less permeable etch stop layer 162 is formed over sections 151 and 152 of the layer 105, e.g., as illustrated in FIG. 3B. The etch stop layer 162 may be formed, e.g., deposited, using an appropriate deposition technique, such as CVD, PVD, ALD, VPE, MBE, or LPE, for example.

Figure 3C:
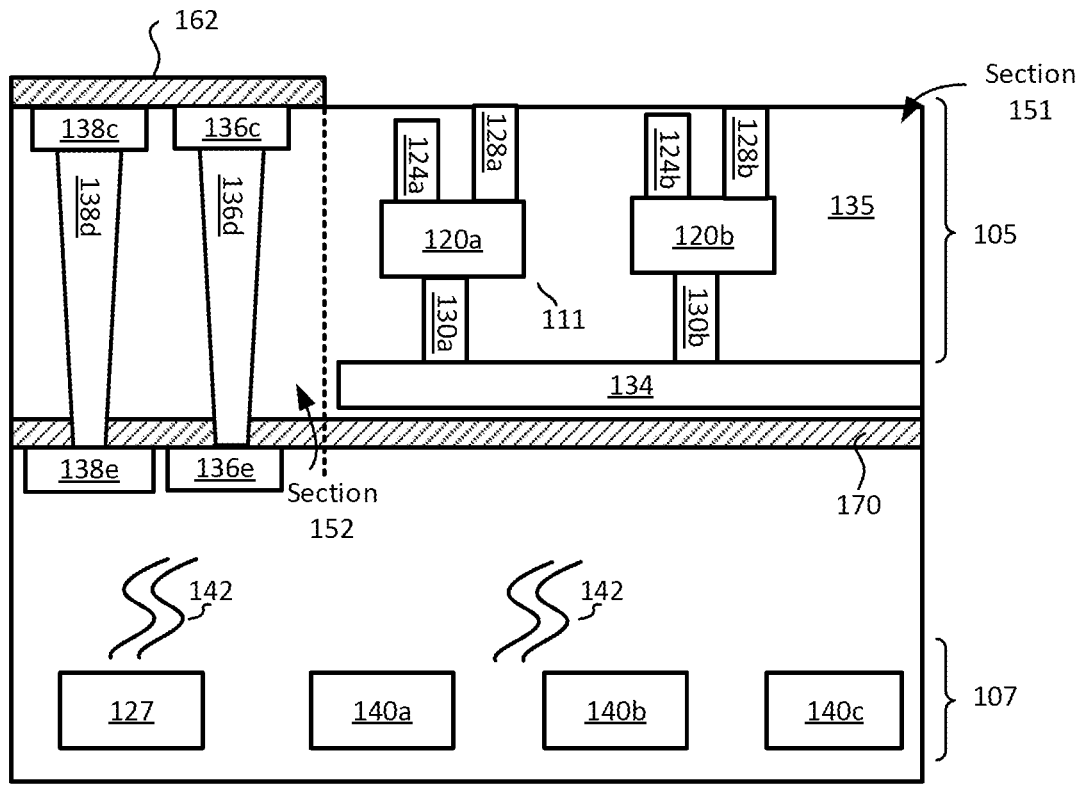

Referring again to FIG. 2, the method 200 then proceeds from 208 to 212, where a portion of the etch stop layer 162, which is above the section 151 of the layer 105, is removed, such that another portion of the etch stop layer 162 remains above the section 152 of the layer 105, e.g., as illustrated in FIG. 3C. In an example, the etch stop layer 162 is patterned using any appropriate masking, lithography, and etching process.

Figure 3D:
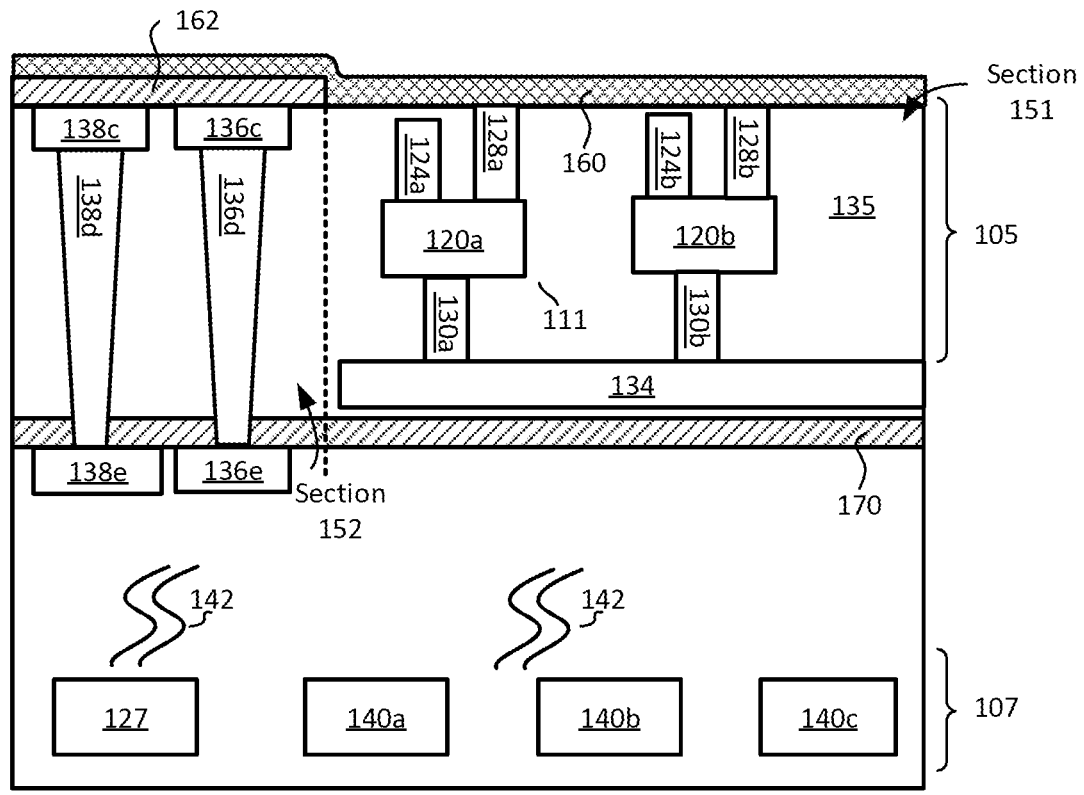

Referring again to FIG. 2, the method 200 then proceeds from 212 to 216, where the etch stop layer 160 is deposited above the sections 151 and 152 of the layer 105, e.g., as illustrated in FIG. 3D. Thus, a portion of the etch stop layer 160 is directly above the section 151, and another portion of the etch stop layer 160 is above the etch stop layer 162. The etch stop layer 160 may be formed, e.g., deposited, using an appropriate deposition technique, such as CVD, PVD, ALD, VPE, MBE, or LPE, for example. In an example, a process used to deposit the etch stop layer 162 at block 208 is different from a process used to deposit the etch stop layer 160 at block 216, e.g., thereby resulting in the previously discussed structural difference between the dielectric materials of the etch stop layers 160, 162. Additionally, or alternatively, the dielectric materials of the etch stop layers 160, 162 may be compositionally different, as also discussed herein previously.

Figure 3E:
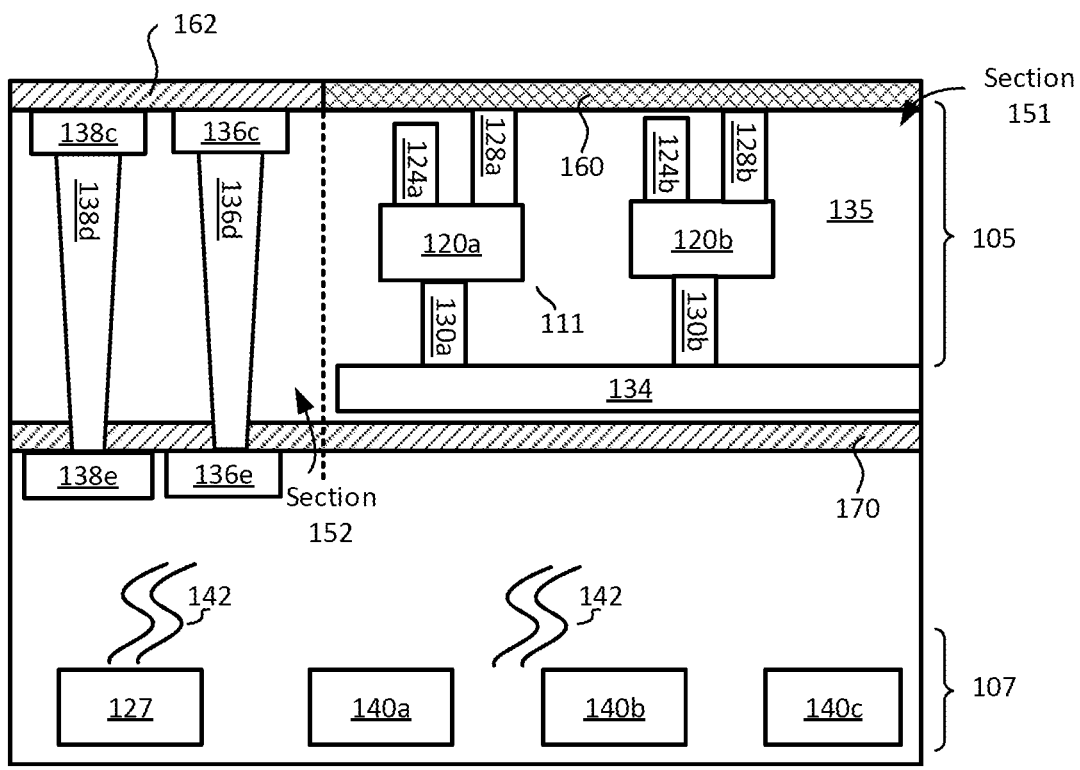

Referring again to FIG. 2, the method 200 then proceeds from 216 to 220, where the etch stop layer 160 is planarized, e.g., to remove at least partially a portion of the etch stop layer 160 that is above the etch stop layer 162, e.g., as illustrated in FIG. 3E. In an example, the planarization results in substantially coplanar top surfaces of the etch stop layers 160, 162, as previously discussed herein. In an example, the process 220 may be optionally skipped, resulting in eventual formation of the IC 100c of FIG. 1C (if the process 220 is performed, this results in eventual formation of the IC 100 of FIG. 1A). The planarization process may be performed using an appropriate planarization technique, such as chemical mechanical polishing (CMP) or mechanical polishing, for example.

Figure 3F:
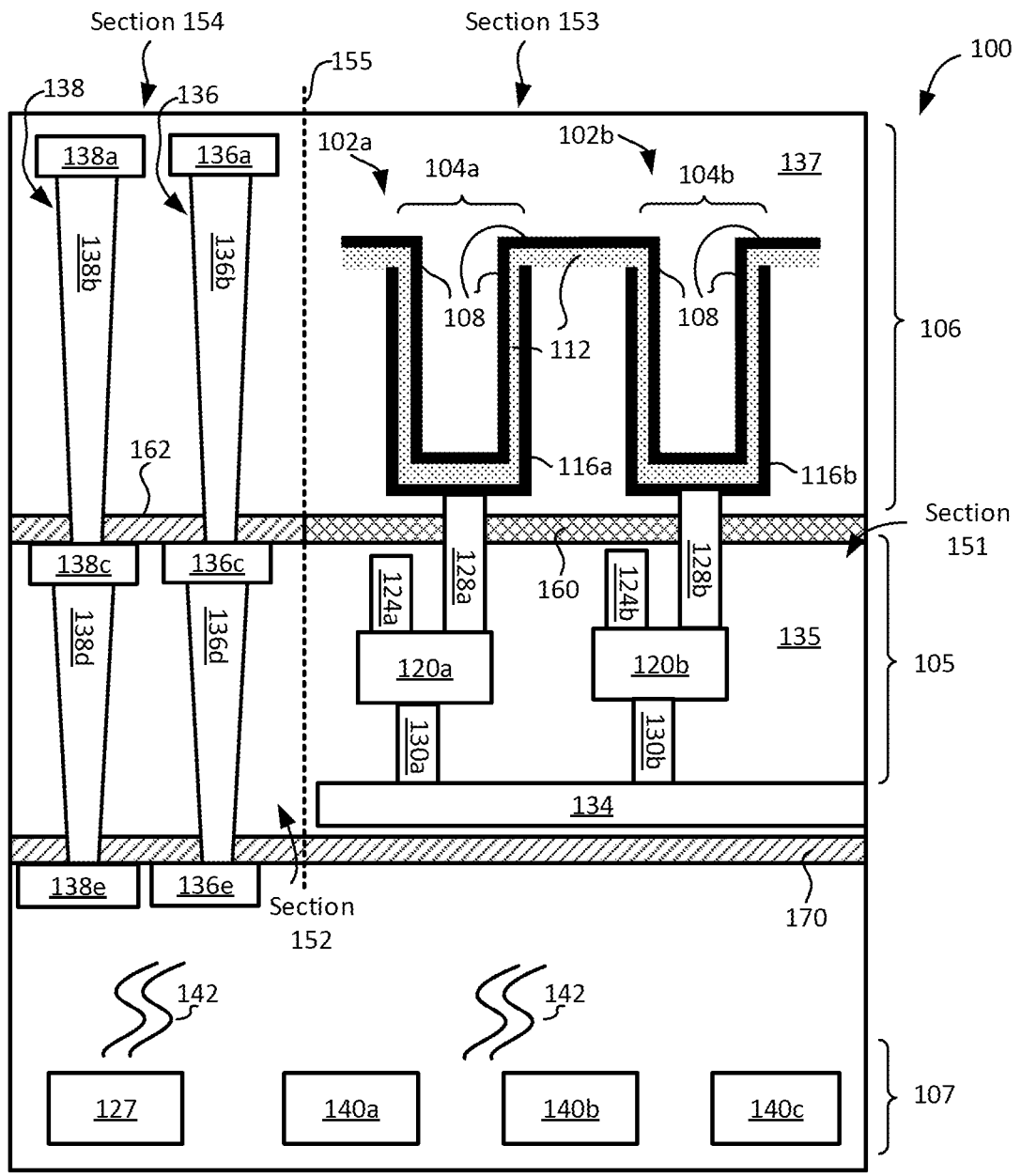

Referring again to FIG. 2, the method 200 then proceeds from 220 to 224, where one or more layers, such as layer 106, are formed above the etch stop layers 160, 162, e.g., as illustrated in FIG. 3F. The various layers may be formed using appropriate techniques for forming device and/or interconnect layers within an IC. The IC of FIG. 3F is same as the IC 100 of FIG. 1A.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
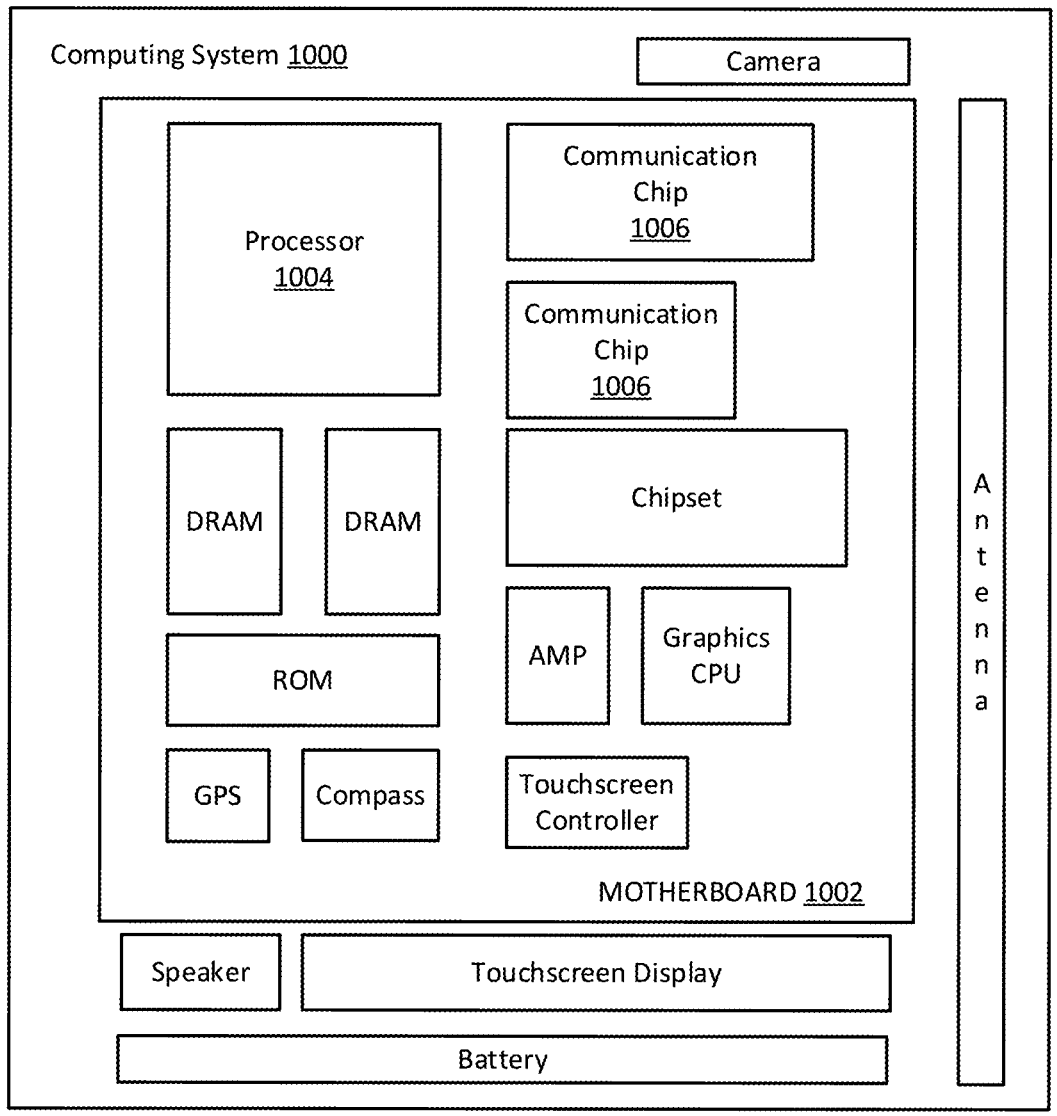
FIG. 4 illustrates a computing system implemented with integrated circuit structures formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1. An integrated circuit comprising: a first layer, and a second layer above the first layer; a third layer between a first section of the first layer and a first section of the second layer, the third layer having a thickness between the first and second layers in the range of 0.5 to 20 nanometers; and a fourth layer laterally adjacent to the third layer, the fourth layer between a second section of the first layer and a second section of the second layer, the fourth layer having a thickness between the first and second layers in the range of 0.5 to 20 nanometers, wherein a first dielectric material of the third layer is different from a second dielectric material of the fourth layer.

Example 2. The integrated circuit of example 1, wherein the first dielectric material of the third layer is compositionally different from the second dielectric material of the fourth layer.

Example 3. The integrated circuit of any one of examples 1-2, wherein the first dielectric material of the third layer is structurally different from the second dielectric material of the fourth layer.

Example 4. The integrated circuit of any one of examples 1-3, wherein the first dielectric material of the third layer and the second dielectric material of the fourth layer have different values of a physical property, and wherein the physical property is one of permeability, porosity, dielectric constant, density, adhesiveness to metal, or hermeticity.

Example 5. The integrated circuit of any one of examples 1-4, wherein a porosity and/or permeability of the first dielectric material of the third layer is more than a porosity and/or permeability, respectively, of the second dielectric material of the fourth layer.

Example 6. The integrated circuit of any one of examples 1-5, wherein a dielectric constant of the first dielectric material of the third layer is less than a dielectric constant of the second dielectric material of the fourth layer.

Example 7. The integrated circuit of any one of examples 1-6, wherein a density of the first dielectric material of the third layer is less than a density of the second dielectric material of the fourth layer Example 8. The integrated circuit of any one of examples 1-7, wherein a hermiticity of the first dielectric material of the third layer is less than a hermeticity of the second dielectric material of the fourth layer Example 9. The integrated circuit of any one of examples 1-8, wherein the third layer comprises one or more of silicon, aluminum, oxygen, or nitrogen, and the fourth layer comprises one or more of silicon, nitrogen, or carbon.

Example 10. The integrated circuit of any one of examples 1-9, wherein a bottom surface of the third layer and a bottom surface of the fourth layer are substantially coplanar.

Example 11. The integrated circuit of any one of examples 1-10, wherein a top surface of the third layer and a top surface of the fourth layer are substantially coplanar.

Example 12. The integrated circuit of any one of examples 1-11, wherein the third layer has the thickness between the first and second layers in the range of 0.5 to 8 nanometers.

Example 13. The integrated circuit of any one of examples 1-12, wherein the fourth layer has the thickness between the first and second layers in the range of 0.5 to 8 nanometers.

Example 14. The integrated circuit of any one of examples 1-13, wherein: the third layer is (i) between the first section of the first layer and the first section of the second layer, and (ii) between the second section of the first layer and the second section of the second layer; and the fourth layer is between the second section of the first layer and the second section of the second layer, and not between the first section of the first layer and the first section of the second layer.

Example 15. The integrated circuit of example 14, wherein: a first portion of the third layer is between the first section of the first layer and the first section of the second layer; a second portion of the third layer is between the second section of the first layer and the second section of the second layer; and the fourth layer is between the second section of the first layer and the second portion of the third layer.

Example 16. The integrated circuit of example 15, wherein the fourth layer is laterally adjacent to the first portion of the third layer.

Example 17. The integrated circuit of any one of examples 1-16, wherein the first section of the first layer comprises one or more thin film transistors (TFT).

Example 18. The integrated circuit of example 17, wherein the second section of the first layer lacks any TFT.

Example 19. The integrated circuit of any one of examples 1-18, wherein the first section of the second layer comprises one or more capacitors.

Example 20. The integrated circuit of any one of examples 1-19, wherein: the first section of the first layer comprises a thin film transistor (TFT); the first section of the second layer comprises a capacitor; and the TFT and the capacitor form, or are part of, a memory cell.

Example 21. The integrated circuit of example 20, wherein the memory cell is a Dynamic Random-Access Memory (DRAM) cell.

Example 22. The integrated circuit of example 20, wherein the memory cell is an embedded Dynamic Random-Access Memory (eDRAM) cell.

Example 23. An integrated circuit comprising: a first layer comprising (i) a first section including one or more thin film transistors (TFTs), and (ii) a second section that is laterally adjacent to the first section and that lacks a TFT; a second layer above the first layer, the second layer comprising (i) a third section that is above the first section of the first layer and that includes one or more capacitors, and (ii) a fourth section that lacks a capacitor; a first etch stop layer between the first section of the first layer and the third section of the second layer; and a second etch stop layer between the second section of the first layer and the fourth section of the second layer, wherein a first dielectric material of the first etch stop layer and a second dielectric material of the second etch stop layer have different values of a physical property.

Example 24. The integrated circuit of example 23, wherein the physical property is one of permeability, porosity, dielectric constant, density, adhesiveness to metal, or hermeticity.

Example 25. The integrated circuit of any one of examples 23-24, wherein the physical property is one of permeability or porosity, and wherein a porosity and/or permeability of the first dielectric material is more than a porosity and/or permeability, respectively, of the second dielectric material.

Example 26. The integrated circuit of any one of examples 23-25, wherein the physical property is dielectric constant, and wherein a dielectric constant of the first dielectric material is less than a dielectric constant of the second dielectric material.

Example 27. The integrated circuit of any one of examples 23-26, wherein the physical property is density, and wherein a density of the first dielectric material is less than a density of the second dielectric material.

Example 28. The integrated circuit of any one of examples 23-27, wherein the first etch stop layer comprises one or more of silicon, aluminum, oxygen, or nitrogen, and the second etch stop layer comprises one or more of silicon, nitrogen, or carbon.

Example 29. The integrated circuit of any one of examples 23-28, wherein a bottom surface of the first etch stop layer and a bottom surface of the second etch stop layer are substantially coplanar.

Example 30. The integrated circuit of any one of examples 23-29, wherein a top surface of the first etch stop layer and a top surface of the second etch stop layer are substantially coplanar.

Example 31. The integrated circuit of any one of examples 23-30, wherein the first dielectric material of the first etch stop layer is compositionally different from the second dielectric material of the second etch stop layer.

Example 32. The integrated circuit of any one of examples 23-31, wherein the first dielectric material of the first etch stop layer is structurally different from the second dielectric material of the second etch stop layer.

Example 33. The integrated circuit of any one of examples 23-32, wherein a TFT of the one or more TFTs and a capacitor of the one or more capacitors is a part of an embedded Dynamic Random-Access Memory (eDRAM) cell.

Example 34. An integrated circuit device comprising: a first section comprising a plurality of memory cells of a memory array; a second section that is laterally adjacent to the first section and that lacks any memory cell of the memory array, the second section including one or more interconnect features; a first etch stop layer within the first section; and a second etch stop layer that is laterally adjacent to the first etch stop layer and that is within the second section, the second etch stop layer being different from the first etch stop layer.

Example 35. The integrated circuit device of example 34, wherein: the plurality of memory cells comprises at least one memory cell comprising (i) a transistor within the first section and below the first etch stop layer, and (ii) a capacitor within the first section and above the first etch stop layer.

Example 36. The integrated circuit device of example 35, wherein the at least one memory cell comprises: a conductive feature extending through the first etch stop layer, and conductively coupling a terminal of the transistor to an electrode of the capacitor.

Example 37. The integrated circuit device of any one of examples 35-36, wherein the transistor is a thin film transistor.

Example 38. The integrated circuit device of any one of examples 35-37, wherein the transistor is a bottom-gated transistor, such that source and drain contacts of the transistor is above the transistor, and a gate contact of the transistor is below the transistor.

Example 39. The integrated circuit device of any one of examples 35-38, wherein the memory cell is an embedded Dynamic Random-Access Memory (eDRAM) cell.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
    a first layer, and a second layer above the first layer;
    a third layer between a first section of the first layer and a first section of the second layer, the third layer having a thickness between the first and second layers in the range of 0.5 to 20 nanometers; and
    a fourth layer laterally adjacent to the third layer, the fourth layer between a second section of the first layer and a second section of the second layer, the fourth layer having a thickness between the first and second layers in the range of 0.5 to 20 nanometers,
    wherein a first dielectric material of the third layer is different from a second dielectric material of the fourth layer, and wherein a top surface of the third layer and a top surface of the fourth layer are substantially coplanar.

2. The integrated circuit of claim 1, wherein the first dielectric material of the third layer is compositionally different from the second dielectric material of the fourth layer.

3. The integrated circuit of claim 1, wherein the first dielectric material of the third layer is structurally different from the second dielectric material of the fourth layer.

4. The integrated circuit of claim 1, wherein the first dielectric material of the third layer and the second dielectric material of the fourth layer have different values of a physical property, and wherein the physical property is one of permeability, porosity, dielectric constant, density, adhesiveness to metal, or hermeticity.

5. The integrated circuit of claim 1, wherein a porosity and/or permeability of the first dielectric material of the third layer is different from a porosity and/or permeability, respectively, of the second dielectric material of the fourth layer.

6. The integrated circuit of claim 1, wherein a dielectric constant of the first dielectric material of the third layer is less than a dielectric constant of the second dielectric material of the fourth layer.

7. The integrated circuit of claim 1, wherein a density of the first dielectric material of the third layer is less than a density of the second dielectric material of the fourth layer.

8. The integrated circuit of claim 1, wherein a hermeticity of the first dielectric material of the third layer is less than a hermeticity of the second dielectric material of the fourth layer.

9. The integrated circuit of claim 1, wherein a bottom surface of the third layer and a bottom surface of the fourth layer are substantially coplanar.

10. The integrated circuit of claim 1, wherein:
the third layer is (i) between the first section of the first layer and the first section of the second layer, and (ii) between the second section of the first layer and the second section of the second layer; and
the fourth layer is between the second section of the first layer and the second section of the second layer, and not between the first section of the first layer and the first section of the second layer.

11. The integrated circuit of claim 1, wherein the first section of the first layer comprises one or more thin film transistors (TFT).

12. The integrated circuit of claim 11, wherein the second section of the first layer lacks any TFT.

13. The integrated circuit of claim 1, wherein the first section of the second layer comprises one or more capacitors.

14. The integrated circuit of claim 1, wherein:
the first section of the first layer comprises a thin film transistor (TFT);
the first section of the second layer comprises a capacitor; and
the TFT and the capacitor form, or are part of, a memory cell.

15. The integrated circuit of claim 14, wherein the memory cell is an embedded Dynamic Random-Access Memory (eDRAM) cell.

16. An integrated circuit comprising:
a first layer comprising (i) a first section including one or more thin film transistors (TFTs), and (ii) a second section that is laterally adjacent to the first section and that lacks a TFT;
a second layer above the first layer, the second layer comprising (i) a third section that is above the first section of the first layer and that includes one or more capacitors, and (ii) a fourth section that lacks a capacitor;
a first etch stop layer between the first section of the first layer and the third section of the second layer; and
a second etch stop layer between the second section of the first layer and the fourth section of the second layer,
wherein a first dielectric material of the first etch stop layer and a second dielectric material of the second etch stop layer have different values of a physical property.

17. The integrated circuit of claim 16, wherein the physical property is one of permeability, porosity, dielectric constant, density, adhesiveness to metal, or hermeticity.

18. The integrated circuit of claim 16, wherein a TFT of the one or more TFTs and a capacitor of the one or more capacitors is a part of an embedded Dynamic Random-Access Memory (eDRAM) cell.

19. An integrated circuit device comprising:
a first section comprising a plurality of memory cells of a memory array;
a second section that is laterally adjacent to the first section and that lacks any memory cell of the memory array, the second section including one or more interconnect features;
a first etch stop layer within the first section; and
a second etch stop layer that is laterally adjacent to the first etch stop layer and that is within the second section, the second etch stop layer having a different material composition than the first etch stop layer.

20. The integrated circuit device of claim 19, wherein:
the plurality of memory cells comprises at least one memory cell comprising (i) a transistor within the first section and below the first etch stop layer, and (ii) a capacitor within the first section and above the first etch stop layer.

21. The integrated circuit device of claim 20, wherein the at least one memory cell comprises:
a conductive feature extending through the first etch stop layer, and conductively coupling a terminal of the transistor to an electrode of the capacitor.

22. The integrated circuit device of claim 19, wherein a top surface of the first etch stop layer and a top surface of the second etch stop layer are substantially coplanar.

* * * * *